(12) United States Patent
Mutnury et al.

(10) Patent No.: US 8,110,500 B2
(45) Date of Patent: Feb. 7, 2012

(54) MITIGATION OF PLATING STUB RESONANCE BY CONTROLLING SURFACE ROUGHNESS

(75) Inventors: Bhyrav M. Mutnury, Austin, TX (US); Moises Cases, Austin, TX (US); Tae Hong Kim, Round Rock, TX (US); Nanju Na, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 233 days.

(21) Appl. No.: 12/255,146

(22) Filed: Oct. 21, 2008

(65) Prior Publication Data

US 2010/0099219 A1    Apr. 22, 2010

(51) Int. Cl.
*H01L 21/44*    (2006.01)
*H01R 9/00*    (2006.01)

(52) U.S. Cl. .......... 438/667; 438/637; 257/678; 29/829; 29/831; 29/842; 29/846

(58) Field of Classification Search .................... 361/767
See application file for complete search history.

(56) References Cited

U.S. PATENT DOCUMENTS

| | | | |
|---|---|---|---|
| 4,875,262 A | 10/1989 | DeGrave | |
| 5,467,252 A * | 11/1995 | Nomi et al. ................... | 361/760 |
| 5,585,195 A | 12/1996 | Shimada | |
| 5,755,949 A | 5/1998 | Amor | |
| 6,381,098 B1 | 4/2002 | Boutaghou et al. | |
| 6,858,123 B1 | 2/2005 | Hu et al. | |
| 7,349,224 B2 | 3/2008 | Ohsaka | |
| 2004/0007313 A1 * | 1/2004 | Day et al. ...................... | 156/153 |
| 2005/0051879 A1 * | 3/2005 | Kuzawinski et al. ......... | 257/676 |
| 2006/0043565 A1 * | 3/2006 | Chia et al. ..................... | 257/690 |
| 2006/0143884 A1 * | 7/2006 | Mitchell et al. .............. | 29/25.41 |

OTHER PUBLICATIONS

Wikipedia "Signal Reflection", http://en.wikipedia.org/wiki/Signal_reflection, Sep. 5, 2008, 1 pages.
Wikipedia "Insertion Loss", http://en.wikipedia.org/wiki/insertion_loss, Sep. 4, 2008, 1 page.
Wikipedia "Q Factor", http://en.wikipedia.org/wiki/Q_factor, Sep. 4, 2008, 4 pages.
Wikipedia "Transmission Line", http://en.wikipedia.org/wiki/Transmission_line, Sep. 4, 2008, 6 pages.

* cited by examiner

*Primary Examiner* — Ha Tran T Nguyen
*Assistant Examiner* — Aaron Dehne
(74) *Attorney, Agent, or Firm* — Cynthia G. Seal; Jeffrey L. Streets

(57) ABSTRACT

Plating stub resonance in a circuit board may be mitigated by increasing surface roughness of the plating stub conductor. Roughening the plating stub increases its resistance due to the skin effect at higher frequencies, which decreases the quality factor of the transmission line and consequently increases the damping factor, to reduce any resonance that would occur in the plating stub as formed prior to roughening. The surface roughness can be increased in a variety of ways, including chemical processes, by selectively applying a laser beam, or by applying an etch-resistance material in selected locations.

7 Claims, 4 Drawing Sheets

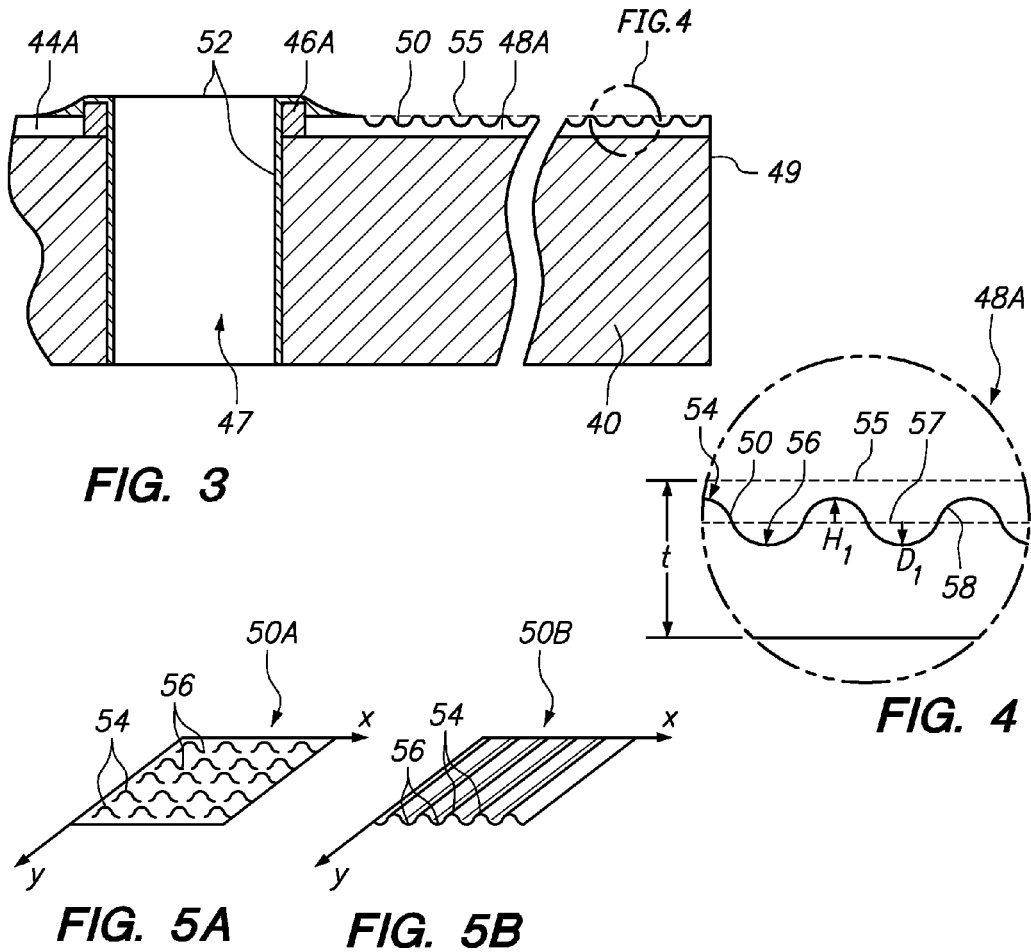
FIG. 3
FIG. 4
FIG. 5A
FIG. 5B
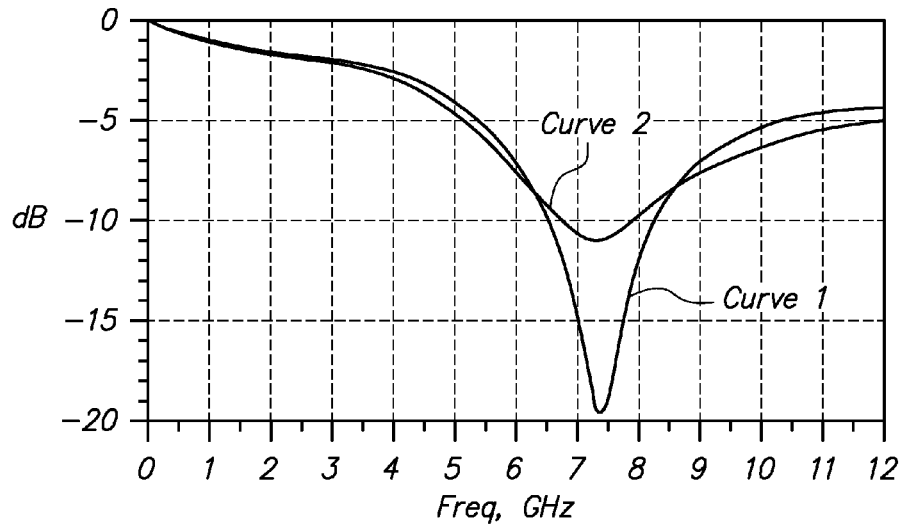
FIG. 6

FIG. 7A
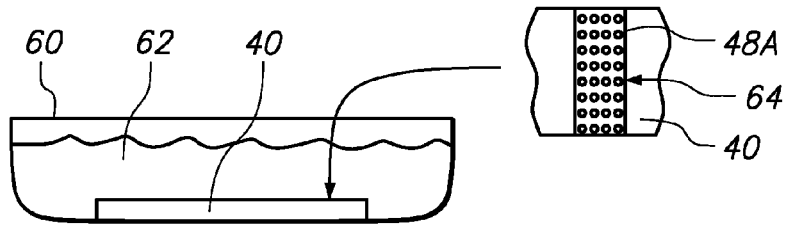
FIG. 7B
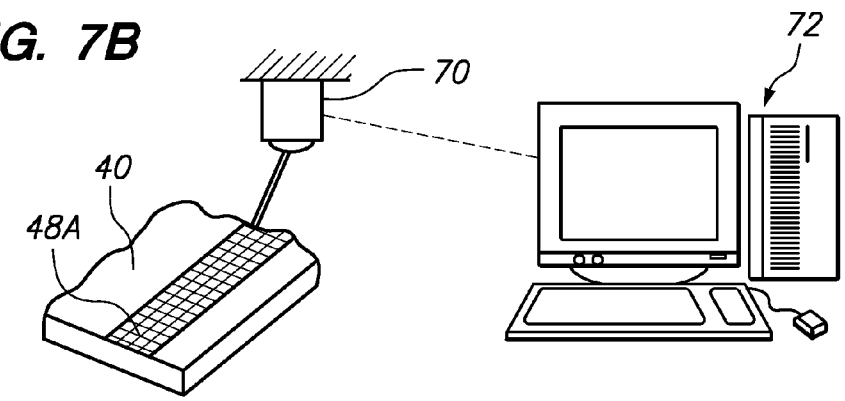
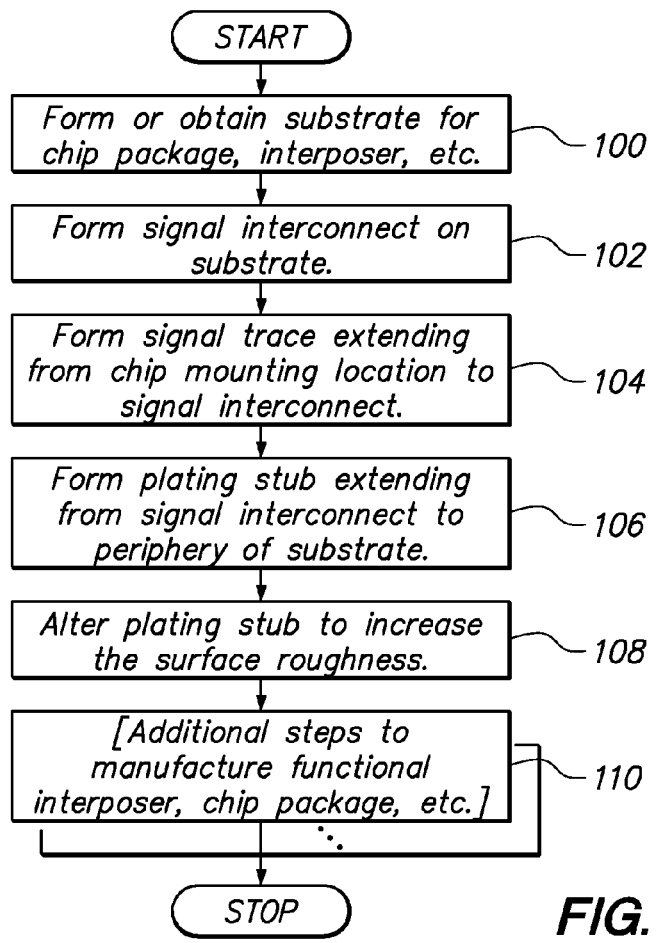
FIG. 8

MITIGATION OF PLATING STUB RESONANCE BY CONTROLLING SURFACE ROUGHNESS

BACKGROUND OF THE INVENTION

1. Field of the Invention

The present invention relates to the problem of resonance due to plating stubs on circuit boards.

2. Background of the Related Art

An integrated circuit (IC), also commonly referred to as a "microchip" or "chip," is an electronic circuit comprising miniaturized semiconductor devices formed in a semiconductor substrate. Many copies of an integrated circuit may be formed on a large semiconductor wafer, which is then cut into individual pieces referred to as a "die chips" or "dies," each containing a copy of the integrated circuit Semiconductor materials such as silicon are typically brittle, so a fragile die chip is commonly packaged on a carrier, referred to as a "chip package" or simply "package." The substrate of the chip package functions as an interposer for interfacing the chip with a printed circuit board (PCB). For example the processor for a computer may be carried on a chip package that is mounted to a motherboard.

The die chip may be electrically connected to a package substrate by wirebonding. Wirebonding is a process known in the art by which a very fine wire is connected from a bond pad on the chip to corresponding signal pathways ("traces") on the package substrate. Bond wires are typically formed of a highly conductive material, such as platinum or other precious metal. A package in which a die chip is connected to the substrate by wirebonding may be referred to as a "wirebond package." The traces on the substrate extend from the location of bonding with the wirebond to signal interconnects elsewhere on the substrate. The signal interconnects on one layer of the substrate may be electrically connected to signal interconnects on another layer of the substrate using through-connections known as "vias." Thus, for example, the signal connects on the face to which the chip is mounted may be connected to corresponding pins of a pin grid array (PGA) or to corresponding balls of a ball grid array (BGA) on the opposing face of the substrate. The PGA or BOA may then be placed in contact with a corresponding pattern of electrical contacts on the PCB to which the chip package is subsequently secured.

Signal traces are typically formed of commonly available materials, such as copper, that are relatively affordable and have sufficient electrical conductivity. Materials having improved electrical conductivity, including precious metals such as platinum and gold, are then selectively applied to the substrate at locations where the expense of such materials is warranted. For example, to facilitate wire bonding, platinum may be applied at locations along the signal traces where wire bonds are formed. Gold is often applied to signal interconnects. These materials are usually applied by electroplating. However, most electroplating processes result in open plating stubs extending from the signal interconnects. The electroplating voltage is applied at or near the periphery of the package substrate, which results in the plating stubs extending to or near the periphery of the substrate.

Plating stubs may hinder signal performance of the package if left intact. An open-ended plating stub can cause signal reflections. Signal performance is greatly impacted by reflections from these open stubs, particularly at higher frequencies wherein the wavelength of the signal is comparable to or less than the length of the plating stub. A quarter-wavelength resonance is particularly detrimental in high speed data transmissions. One solution to avoid signal degradation caused by plating stubs is to remove the plating stubs by additional etching. However, such measures increase manufacturing costs and decrease product yield.

BRIEF SUMMARY OF THE INVENTION

Embodiments of the invention include, for example, a chip package and a method of manufacturing the chip package. The chip package may include a substrate, a signal interconnect disposed on the substrate, a signal trace extending along the substrate from near a chip mounting location to the signal interconnect, and a plating stub extending from the signal interconnect to a periphery of the substrate. The plating stub is roughened to dampen resonance that would ordinarily occur in the signal trace as result of an open-ended plating stub. The roughness may be controlled to achieve a desired amount of resonance dampening.

BRIEF DESCRIPTION OF THE SEVERAL VIEWS OF THE DRAWINGS

FIG. 3 is a sectioned view of the substrate in a cutting plane normal to the substrate.

FIG. 4 is a detail view of a portion of the plating stub of FIG. 3, enlarged to better show the profile of the roughened surface.

FIG. 5A is a perspective view of a roughened surface patch wherein the peaks and the valleys are spaced apart in two dimensions.

FIG. 5B is a perspective view of another roughened surface patch wherein the peaks and valleys are spaced apart in only one dimension.

FIG. 6 is a graph comparing the transmission characteristic of a signal trace prior to and after roughening the plating stub according to an embodiment of the invention.

FIG. 7A is a schematic diagram depicting a process of roughening the plating stub using chemical etching.

FIG. 7B is a schematic diagram depicting an alternative process of roughening the plating stub using a computer-controlled laser.

FIG. 8 is a flowchart outlining a method of manufacturing a chip package, an interposer, or other electronic assembly or sub-assembly.

DETAILED DESCRIPTION OF THE INVENTION

The present invention is directed to mitigating resonance caused by plating stubs. The invention may be embodied, for example, as a method of forming a chip package. Plating stubs are intentionally roughened according to the invention to increase their resistance, due to the skin effect at higher frequencies. Increasing the resistance in this manner decreases the quality factor of the plating stub when viewed as a transmission line, which increases the damping factor. Increasing the damping factor reduces resonance that would otherwise occur in the plating stub. The surface roughness can be increased in a variety of ways, including by selectively applying a laser beam, or by applying an etch-resistance material in selected locations along the plating stub, to form a roughened surface having a desired profile of peaks and valleys. The profile of the roughened surface may be controlled to achieve a resistance value providing the desired degree of resonance mitigation.

Figure 1:
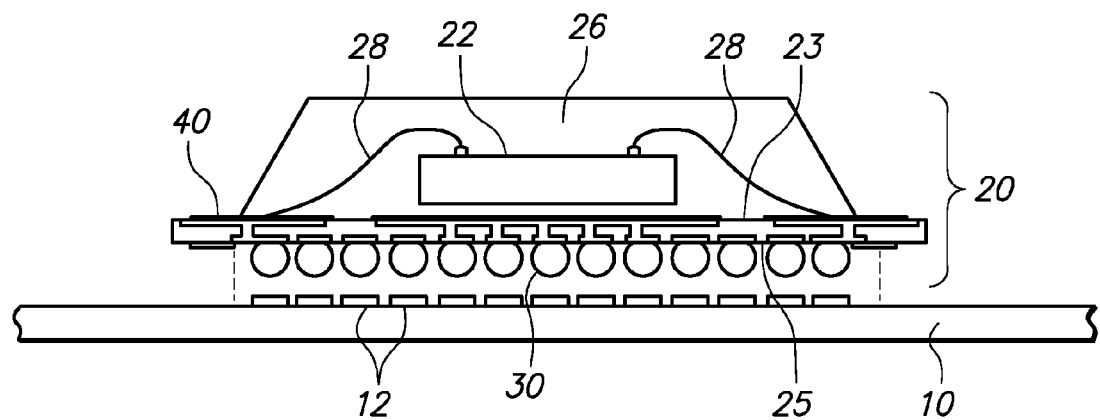
FIG. 1 is a schematic side view of a surface-mount, semiconductor chip package configured for assembly to a surface of a printed circuit board (PCB).

FIG. 1 is a schematic side view of a surface-mount, semiconductor chip package 20 configured for assembly to a surface of a printed circuit board (PCB) 10. The package substrate 40 only shows two layers for simplicity of illustration, but such a substrate typically has multiple layers, such as one or more power layers, one or more ground layers, one or more signal layers, and one or more dielectric layers sandwiched between selected conductive or signal layers. The package 20 includes a chip 22 mounted on a first face 23 of a package substrate 40. Although not required, the chip 22 may be enclosed in a protective housing 26, such as molded plastic encapsulating the chip 22. The chip 22 is electrically connected to a ball grid array (BGA) disposed on a second face 25 opposite the first face 23. In the orientation shown, the first face 23 may be referred to as the top face and the second face 25 may be referred to as the bottom face.

The package substrate 40 functions as an interposer for interfacing the chip 22 with the PCB 10. The array of balls 30 are aligned for contact with a corresponding pattern of electrical contacts or pads 12 on the PCB 10. The balls 30 may be heated to melting or softening while in contact with the electrical pads 12 on the PCB 10, and then cooled to secure the BGA. Alternatively, pins or other electrical contacts may be provided on the substrate 40 in lieu of a ball grid array, with an appropriate choice of electrical contacts on the PCB 10 for mating with the pins or other electrical contacts on the substrate 40.

Figure 2:
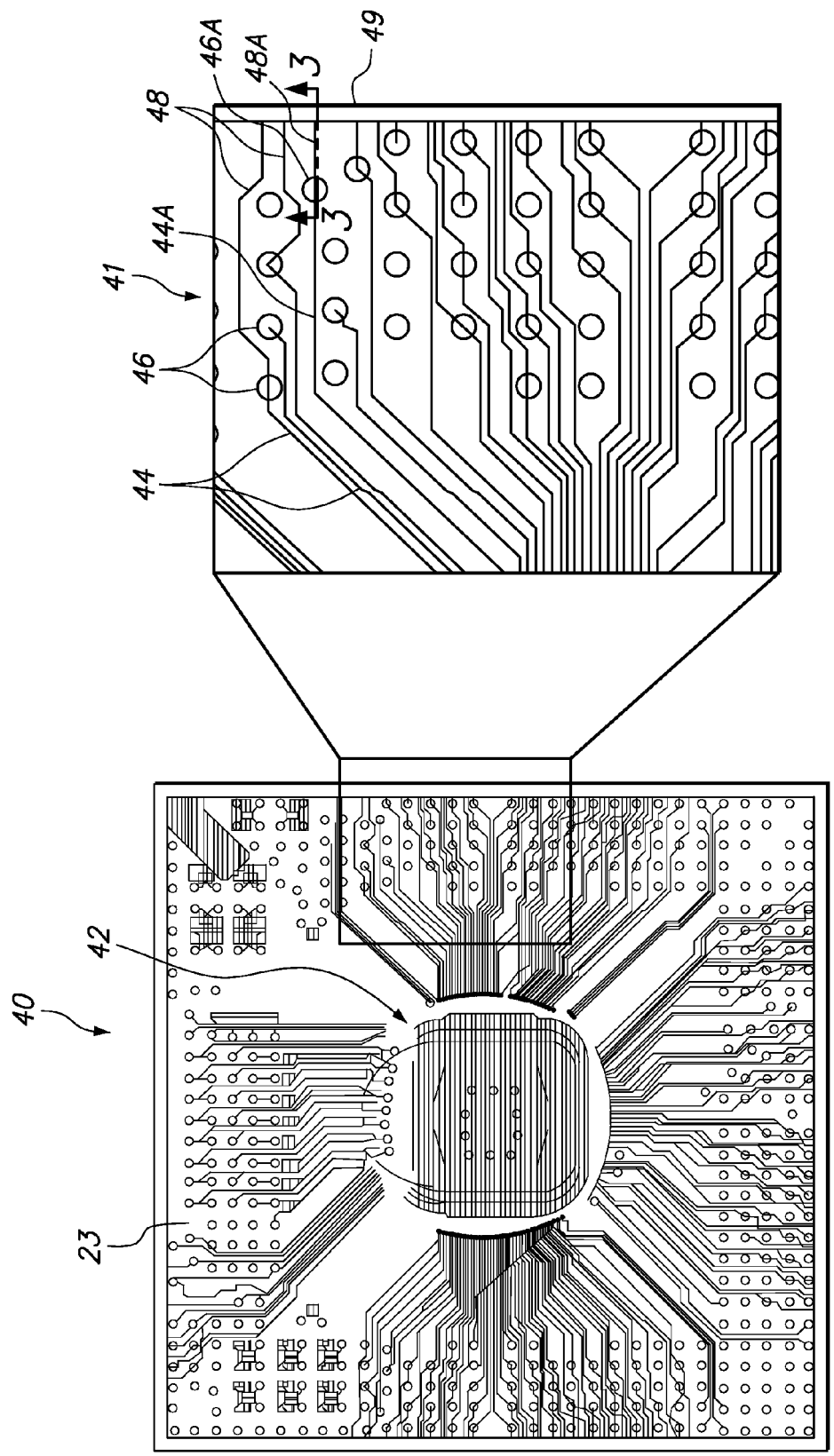
FIG. 2 is a plan view of the package substrate.

FIG. 2 is a plan view of the package substrate 40 without the chip 22, housing 26 or bond wires 28. The figure includes an enlarged view of a portion 41 of the substrate 40. The substrate 40 provides a central chip mounting location 42 for receiving the chip 22 (see FIG. 1). A plurality of discrete electrical pathways, embodied here as signal traces 44, is formed on the substrate 40. The signal traces 44 may be formed according to known techniques in the art of circuit board manufacturing. The signal traces 44 may be formed, for example, by a subtractive process, in which a sheet of copper or other conductive material laminated to the substrate 40 is etched away to leave the desired pattern of traces. Less commonly, the signal traces 44 may be formed by an additive process, in which copper is plated onto the substrate 40 in the desired pattern such that no etching is required. A plurality of signal interconnects 46 (alternatively referred to as electrode pads) are positioned across the top face 23 of the substrate 40. The signal interconnects 46 are concentric with vias, which are through-holes extending through the substrate 40. Each signal trace 44 extends outwardly from the chip mounting location 42 to a corresponding one of the signal interconnects 46.

Features of the substrate 40 may be electroplated, such as the signal interconnects 46, the vias concentric with the signal interconnects 46, and portions of the signal traces 44 where bond wires are to be attached. Open-ended plating stubs 48 are added to facilitate the electroplating of these features. As best shown in the enlarged portion 41, the plating stubs 48 extend outwardly from many of the signal interconnects 46 in a direction away from the chip mounting location 42 to a periphery 49 of the substrate 40. The plating stubs for other signal interconnects are routed on the opposite side of the substrate 40 from BGA pads to the periphery 49. The signal traces 44 and the plating stubs 48 extend outwardly from the centrally located chip mounting location 42, although it is not necessary for the signal traces 44 or plating stubs 48 to be straight or lie exactly on radii extending from a common center. The plating stubs 48 are open ended by virtue of extending past the respective signal interconnects 46 without connecting to another device or conductive pathway. Typically, the open plating stubs 48 extend all the way from one of the signal interconnects 46 to or near the periphery 49 of the substrate 40, because to perform gold plating for electrode pads on the substrate 40, the electrode pads are typically rendered conductive from the outer edge of the substrate 40.

FIG. 3 is a sectioned view of the substrate 40 in a cutting plane. "3-3" normal to the substrate 40. One of the signal traces 44A extends along the substrate 40 to one of the signal interconnects 46A. The plating stub 48A extends from the signal interconnect 46A to the periphery 49 of the substrate 40. A thin plating layer 52 of highly conductive material (e.g. gold or platinum) has been electrodeposited at selected locations using an electrode (not shown) at the periphery 49 of the substrate 40. The selected locations to which the plating layer 52 has been applied include the signal interconnect 46A, a via 47 concentric with the signal interconnect 46A, and a portion of the plating stub 48A.

The nominal surface 55 of the plating stub 48A, as initially formed, is altered according to an aspect of the invention to increase surface roughness, resulting in a roughened surface 50. The roughened surface 50 may be formed, for example, using a "subtractive" process of removing material from the plating stub 48A, such as laser or chemical etching processes described below. The nominal surface 55 of the plating stub 48A may have some degree of roughness, but is smooth in comparison to the subsequently roughened surface 50, and the nominal surface 55 is therefore represented by a straight, dashed line.

FIG. 4 is a detail view of a portion of the plating stub 48A of FIG. 3, enlarged to better show an exemplary roughness profile 58 of the roughened surface 50. The roughness profile 58 is the contour of roughened surface 50 in a plane perpendicular to the nominal surface 55 of the plating stub 48A. The roughness profile 58 has alternating peaks 54 and valleys 56 that deviate with respect to a graphical centerline indicated at 57. The graphical centerline 57 is a line parallel to the general direction of the plating stub 48A, such that the sums of the areas contained between it and those parts of the profile that lie on either side are equal. Each peak 54 is the point of maximum height on that portion of the roughness profile 58 that lies above the graphical centerline 57 and between adjacent intersections of the roughness profile 58 with the graphical centerline 57. Each valley 56 is the point of maximum depth on that portion of the roughness profile 58 that lies below the graphical centerline 57 and between adjacent intersections of the roughness profile 58 with the graphical centerline 57.

Roughness may be characterized in terms of the deviation of the roughness profile 58 with respect to a reference line, such as the graphical centerline 57. The deviations are measured normal to the centerline 57. For example, the individual height (H1) of one of the peaks 54 and individual depth (D1) of one of the valleys 56 with respect to the graphical centerline 57 is labeled in the figure. The roughness of the plating stub 48A may be quantified in a variety of ways including, for example, "roughness average" or "root-mean-square (RMS) average." Roughness average is the arithmetic average of the absolute value of the profile deviation along a selected sample length (not just at the locations of the peaks 54 or valleys 56), as measured from the graphical centerline 57. Roughness average may be indicated in micrometers (μm). The RMS average is the square root, of the average value squared, of the deviation from the centerline 57. Yet another way to quantify roughness is the peak-to-valley deviation, which is the maximum excursion above the centerline 57 plus the maximum excursion below the centerline 57. The peak-to-valley height is often, but is not required to be, about three or more times the roughness average. Another parameter, known as the "roughness spacing," is the average spacing between adjacent peaks.

Roughness may alternatively be measured according to the depth, in micrometers, from the nominal surface 55 of the plating stub. In one embodiment, the average depth of the valleys 56 may be between about 5 to 15 μm. The depth from the nominal surface 55 may also be limited to no more than one-half of the thickness "t" of the plating stub 48A.

A plating stub may be roughened according to the invention to form peaks and valleys spaced in either one or two dimensions. FIG. 5A is a perspective view of a roughened surface 50A wherein the peaks 54 and the valleys 56 are spaced apart in both "x" and "y" directions, similar to the rough surface of sandpaper. By comparison, FIG. 5B is a perspective view of another roughened surface 50B wherein the peaks 54 and valleys 56 are spaced apart in only the x-direction. Thus, the roughened surface 50B resembles a plurality of parallel ridges. Either laser or chemical etching techniques described below may be controlled to produce a roughness profile having peaks and valleys distributed in either one dimension (e.g. FIG. 5B) or two dimensions (e.g. FIG. 5A).

FIG. 6 is a graph comparing the transmission characteristic of a signal trace prior to roughening an open plating stub (Curve 1), and the transmission characteristic of the signal trace after roughening the plating stub according to an embodiment of the invention (curve 2). The roughness is approximately one-half of the thickness of the plating stub. As indicated by Curve 1, a quarter wavelength, resonance results from the presence of the as-formed plating stub, prior to roughening. The insertion loss of the signal is almost 20 dB at around 7.5 GHz. This resonance will severely degrade signal integrity due to the sudden increase in loss. As indicated by Curve 2, the resonance is significantly dampened by roughening the plating stub, realistically resulting in a 10 dB improvement. This improvement drastically improves the signal quality throughout the chip package.

The dampening of the resonance is due to the "skin effect" at higher frequencies. The skin effect is the tendency of an alternating electric current (AC) to distribute itself within a conductor, such as a plating stub, so that the current density near the surface of the conductor is greater than that at its core. That is, the electric current tends to flow at the "skin" of the conductor. The skin effect causes the effective resistance of conductor to increase with the frequency of the current. Roughening the conductor surface increases the resistance R resulting from the skin effect. The increase in resistance. R caused by roughening the surface of a plating stub decreases the quality factor Q of the plating stub as a transmission line, according to the following relationship, wherein L is the inductance and C is the capacitance of the circuit:

$$Q = \frac{1}{R} * \sqrt{\frac{L}{C}}$$

Decreasing the quality factor Q desirably increases the damping factor ζ according to the relationship:

$$\zeta = \frac{1}{2Q}.$$

By increasing the damping factor, the transmission characteristic is improved, as exemplified by Curve 2 in FIG. 6.

A roughness profile capable of achieving a desired value of resistance R may be mathematically predicted or empirically determined. Many equations are available relating surface roughness with resistance. For example, if the peaks and valleys of the profile are assumed to be triangular, as in FIG. 4, the value of resistance R and the surface roughness are related according to the approximation:

$$R = 7 * \mathrm{sqrt}(\rho \mu f) * L/W,$$

wherein ρ is resistivity, μ is permeability, f is frequency, is the length of the roughened surface, and W is the width of the roughened surface. Alternatively, the relationship between resistance R and the roughness profile can be modeled using either two-dimensional or three-dimensional electromagnetic software tools known generally in the art. Thus, the surface roughness of plating stubs for a particular application may be carefully controlled to achieve the desired resistance R value.

FIG. 7A is a schematic diagram depicting a process of roughening the plating stub 48A using chemical etching. The substrate 40 is immersed in a vessel 60 containing etching chemicals 62 capable of dissolving the copper or other material used for the plating stub 48A. Prior to immersing the substrate 40 in the vessel 60, a pattern of etch resistant material 64 is applied to the plating stub 48A. In this example, the etch resistant material 64 is applied in a dot matrix. The etching chemicals 62 dissolve more material of the plating stub 48A in the spaces between the dots than from the portion of the plating stub 48A directly beneath the dots of the etch-resistant material 64, which leaves behind a roughened surface profile that includes a two-dimensional array of peaks and valleys in the plane of the plating stub 48A. The chemical etching process depicted in FIG. 7A provides some ability to control the roughness profile. For example, the width and spacing of the dots in the pattern of etch resistant material 64 may be selected to control the width and spacing of the peaks and valleys in the roughness profile. The length of time the substrate 40 is immersed in the etching chemicals 62 may be selected to control the depth of the valleys.

FIG. 7B is a schematic diagram depicting an alternative process of roughening the plating stub 48A using a laser 70. Movement and intensity of the laser 70 are precisely controlled using a computerized control system 72. The control system 72 may be programmed to form a roughened surface on the plating stub 48A having the desired profile. The laser process depicted in FIG. 7B may provide an even greater ability to control the roughness profile. For example, the movement of the laser 70 may be controlled to provide a desired width and spacing of the peaks and valleys in the roughness profile. The intensity of the laser 70 and/or the speed of movement of the laser 70 may be controlled to achieve a desired depth of the valleys. If desired, the movement of the laser 70 may even be controlled with enough precision to achieve a desired profile, such as to form generally triangular peaks and valleys.

While various techniques for forming a roughened surface according to the invention (e.g. by laser or chemical etching)

may be controlled to an extent necessary to achieve a desired level of resonance dampening, attaining that level of resonance dampening does not require forming a homogenous or perfectly uniform pattern of roughness. For example, forming a roughened surface having even a random surface pattern, such as peaks and valleys of varying size, shape and spacing, may result in the desired level of resonance dampening.

FIG. 8 is a flowchart outlining a method of manufacturing a chip package, an interposer, or other electronic assembly or sub-assembly according to one or more embodiments of the invention. While the following description summarizes the steps of the flowchart, additional details regarding the individual steps may be informed by reference to the preceding description and figures. In step 100, a substrate is formed or otherwise obtained. The substrate is typically a layered semiconductor substrate on which various circuit elements are formed or may be formed. In step 102, a signal interconnect is formed on the substrate. In the case of a multi-layered substrate, the signal interconnect may be formed on a particular layer, and the step of forming the signal interconnect may be a sub-step of forming the substrate (step 100). In step 104, a signal trace is formed on the substrate, extending from a chip mounting location of the substrate to the signal interconnect. In step 106, a plating stub is formed on the substrate, extending from the signal interconnect to or near the periphery of the substrate. Another step (not shown) may involve positioning an electrode at the periphery of the substrate in contact with the plating stub and plating selected locations of the substrate, such as wire bond locations and vias.

In step 108, the plating stub is altered to deliberately increase the surface roughness of the plating stub, to dampen resonance that would otherwise have occurred along the signal traces due to the presence of the plating stubs. For example, a guided laser may be used to selectively remove material, or the plating stub may be chemically etched to remove material, to form a roughened surface having an array of peaks and intervening valleys. The peaks of the roughened surface are distributed in either one or two dimensions in a plane of the substrate, and project in a third dimension (orthogonally) from the plane of the substrate. The peaks and valleys need not be completely uniform. However, the surface may be roughened in a controlled fashion to achieve desired roughness parameters. Examples of parameters that may be controlled include profile shape (e.g. peaks having a particular shape), roughness average, RMS average, peak-to-Valley height, peak height, valley depth, and/or roughness spacing. The roughness parameters may be predetermined, e.g. arithmetically or empirically, to achieve a desired resistance value due to the skin effect so that any resonance will be adequately dampened.

Steps 102-108 may be followed to form a plurality of signal interconnects, signal traces, and plating stubs on the substrate. For example, a typical substrate for a chip package will require multiple sign traces, plating stubs, and signal interconnects.

A group of steps 110 includes steps for manufacturing a functional interposer, chip package, or other electronic assembly or sub-assembly in which the completed substrate will be used. For example, a chip may be secured to the substrate at the chip mounting location, and wire bonded to the signal traces on the substrate. Vias may be formed and plated to couple signal traces on one layer of the substrate with signal traces on another layer of the substrate. A ball grid array or other electrical contact array may also be assembled to the interposer, chip package, or other electronic assembly or sub-assembly, for interfacing the chip package with another circuit board.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
    forming a signal interconnect on a substrate of a circuit board;
    forming a signal trace extending from near a chip mounting location of the circuit board to the signal interconnect;
    forming a plating stub extending from the signal interconnect to a periphery of the substrate along the exterior surface of the circuit board; and
    altering the as-formed plating stub to increase the surface roughness of the plating stub.

2. The method of claim 1, wherein the step of altering the as-formed plating stub to increase the surface roughness of the plating stub comprises selectively removing material from the plating stub using a laser.

3. The method of claim 1, wherein the step of altering the as-formed plating stub to increase the surface roughness of the plating stub comprises etching the plating stub with chemicals.

4. The method of claim 1, wherein the step of altering the as-formed plating stub to increase the surface roughness of the plating stub comprises forming surface deviations of between about five to fifteen micrometers.

5. The method of claim 1, wherein the step of altering the as-formed plating stub to increase the surface roughness of the plating stub comprises forming surface deviations of up to half the thickness of the as-formed plating stub.

6. The method of claim 1, further comprising:
    mounting a chip to the substrate at the chip mounting location; and
    connecting a bond pad on the chip to the signal trace using a bond wire.

7. The method of claim 1, further comprising:
    electrically connecting the signal interconnect to the ball of a ball grid array.

* * * * *